United States Patent
Butler

(10) Patent No.: US 7,839,155 B2
(45) Date of Patent: Nov. 23, 2010

(54) METHODS AND APPARATUS TO ANALYZE ON-CHIP CONTROLLED INTEGRATED CIRCUITS

(75) Inventor: Kenneth Michael Butler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 12/335,286

(22) Filed: Dec. 15, 2008

(65) Prior Publication Data

US 2010/0148808 A1 Jun. 17, 2010

(51) Int. Cl.
*G01R 31/02* (2006.01)
(52) U.S. Cl. .................. 324/754; 324/763; 324/765
(58) Field of Classification Search ......... 324/754–765; 714/724–734; 716/4; 438/14–17
See application file for complete search history.

(56) References Cited

U.S. PATENT DOCUMENTS

| | | | |
|---|---|---|---|
| 4,513,418 A | 4/1985 | Bardell, Jr. et al. | |
| 4,959,832 A | 9/1990 | Bardell, Jr. | |
| 5,150,366 A | 9/1992 | Bardell, Jr. et al. | |
| 5,349,587 A | 9/1994 | Nadeau-Dostie et al. | |
| 5,442,640 A | 8/1995 | Bardell, Jr. et al. | |
| 5,659,312 A | 8/1997 | Sunter et al. | |
| 5,923,676 A | 7/1999 | Sunter et al. | |
| 6,184,048 B1 | 2/2001 | Ramon | |
| 6,185,712 B1 * | 2/2001 | Kirihata et al. | 714/732 |
| 6,211,803 B1 | 4/2001 | Sunter | |
| 6,586,921 B1 | 7/2003 | Sunter | |
| 6,691,269 B2 | 2/2004 | Sunter | |
| 6,961,871 B2 | 11/2005 | Danialy et al. | |
| 7,129,735 B2 | 10/2006 | Subramaniam et al. | |
| 7,159,159 B2 | 1/2007 | Sunter | |
| 7,219,282 B2 | 5/2007 | Sunter et al. | |
| 7,248,102 B2 * | 7/2007 | Haetty | 327/547 |
| 7,345,495 B2 * | 3/2008 | Dangelo et al. | 324/760 |

OTHER PUBLICATIONS

Second-Generation SmartReflex Power and Performance Management Technologies, web page http://focus.ti.com/general/docs/wtbu/wtbugencontent.tsp?templateId=6123&navigationId=12032&contentId=4609, 2 pages, Retrieved on Sep. 16, 2008.
Brian Carlson, Bill Giolma, SmartReflex Power and Performance Management Technologies: reduced power consumption, optimized performance, Feb. 2008, 8 pages.

* cited by examiner

*Primary Examiner*—Ha Tran T Nguyen
*Assistant Examiner*—Arleen M Vazquez
(74) *Attorney, Agent, or Firm*—William B. Kempler; Wade J. Brady, III; Frederick J. Telecky, Jr.

(57) ABSTRACT

Methods and apparatus for analyzing an integrated circuit are disclosed. An example method includes supplying power to an on-chip supply power regulator of integrated circuit, instructing the on-chip supply power regulator to output a circuit supply signal having a desired minimum voltage level for the integrated circuit, instructing the integrated circuit to initiate an on-chip self-test process, analyzing the results of the on-chip self-test process, and repeating the process after stepping down the voltage of the circuit supply signal level.

19 Claims, 3 Drawing Sheets

# METHODS AND APPARATUS TO ANALYZE ON-CHIP CONTROLLED INTEGRATED CIRCUITS

TECHNICAL FIELD

This disclosure pertains to integrated circuits and, more particularly, to methods and apparatus to analyze on-chip controlled integrated circuits.

BACKGROUND

In the past, integrated circuits on a semiconductor were powered by the power signal(s) supplied to the die. For example, if 3.3 volts(V) was supplied to the die, the circuits on the die operated using 3.3V. Alternatively, if some circuits on the die operated using 5V and some operated using 3.3V, both 3.3V and 5V needed to be provided to the die.

Recently, supply power regulators have been included in integrated circuits to enable control of the power provided to an integrated circuit. For example, if a die is supplied with 5V, a supply power regulator can output a signal having a lower voltage (e.g., 3.3V). Thus, a single voltage supply may be provided to the die and multiple, lower supply voltages may be created using voltage regulators implemented on the die. Reducing the voltage can result in reducing power consumption and extended battery life in battery-powered devices. Additionally, portions of the die may be placed in a sleep mode when not in use so that those portions consume little or no power. One example supply power regulator technology is the SmartReflex™ technology from Texas Instruments, Inc.

An example integrated circuit 100 including a supply power regulator 102 is illustrated in FIG. 1. The example integrated circuit 100 includes the supply power regulator 102, a memory 104, and a processor 106. The example supply power regulator 102 receives a power input and provides an output power signal to the memory 104 and/or the processor 106. The supply power regulator 102 can control the output voltage, current, frequency, or any other characteristic of an output power signal. While the example integrated circuit 100 includes only the supply power regulator 102, the memory 104, and the processor 106, a supply power regulator may be used in a circuit having any number or type of components.

The example processor 106 executes instructions stored in the memory 104. In addition, the processor 106 can be controlled and/or instructions for execution can be provided by a processor control line. The memory 104 can be read and/or written-to via a read/write control line. The memory 104 of the illustrated example includes an on-board self-test process. The on-board self-test process instructs the processor 106 test part or all of the memory 104 to verify that the memory 104 is operating properly. The result of the on-board self-test process is stored in the memory 104, or output by the read/write control line.

SUMMARY OF THE INVENTION

Example methods and apparatus to test on-chip controlled integrated circuits are disclosed herein. In an example implementation, an integrated circuit that includes an on-chip regulator is contacted by one or more test probes of a test apparatus. The test apparatus then provides power to the regulator of the integrated circuit. The test apparatus controls the regulator to adjust the power output by the regulator to the components of the integrated circuit. After controlling the regulator to a desired output, the test apparatus causes one or more components of the integrated circuit to initiate a self-test process. The test apparatus receives the result of the self-test process. The test apparatus then controls the regulator to output another desired output and a self-test process is initiated. By iteratively controlling the regulator and initiating self-test processes, the test apparatus can analyze the operating capabilities of the integrated circuit.

An example test apparatus includes a power supply to provide power to an integrated circuit and a processing unit to control and analyze the integrated circuit. An example processing unit includes a processor to control a regulator of an integrated circuit and to receive and analyze the results of a self-test process performed at the integrated circuit and a memory to store the results of the analysis.

DETAILED DESCRIPTION

Although the following discloses example systems including, among other components, hardware and software executed on hardware, it should be noted that such systems are merely illustrative and should not be considered as limiting. For example, it is contemplated that any or all of these hardware and software components could be embodied exclusively in dedicated hardware, exclusively in software, exclusively in firmware or in some combination of hardware, firmware and/or software. Accordingly, while the following describes example systems, persons of ordinary skill in the art will readily appreciate that the examples are not the only way to implement such systems.

Figure 2:
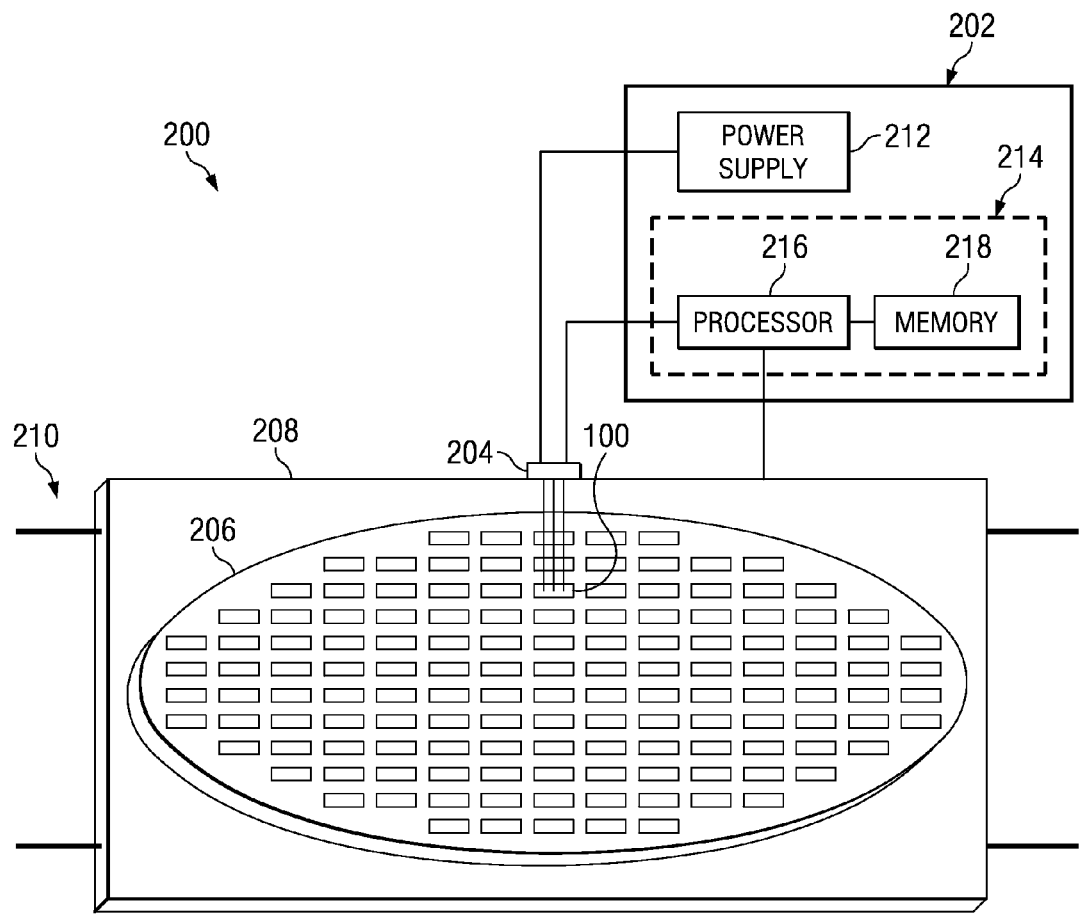
FIG. 2 is a block diagram of an example system for analyzing an integrated circuit.

As shown in FIG. 2, an example integrated circuit analysis system 200 includes an analyzer 202, a test probe 204, a unit under test (UUT) 206 including the integrated circuit 100, a chuck 208, and a conveyor 210. In one example, the analyzer 202 includes a power supply 212 and a processing unit 214 including a processor 216 and a memory 218. As will be readily appreciated, the system 200 may include various other components and/or systems that, for the sake of clarity, are not shown in FIG. 2.

As described below in detail, the conveyor 210 moves the chuck 208 holding the UUT 206 into place under the test probe 204. The chuck 208 is raised (or the test probe is lowered) so that the integrated circuit 100 (integrated circuit 100 of FIG. 1) of the UUT 206 is brought into contact with the test probe 204 thereby connecting the power supply 212 with the power regulator 102 and the processing unit 214 with the memory 104 and/or the processor 106. The analyzer 202 then provides power to the integrated circuit 212, controls the supply power regulator 102 to provide a desired power to the memory 104 and/or the processor 106, instructs the integrated circuit 100 to perform a self-test, and analyzes the result of the self-test. By iteratively analyzing the integrated circuit 100 at a variety of desired input voltages, the analyzer 202 determines valid operating characteristics of the integrated circuit 100.

In the example of FIG. 2, the conveyor 210 and the chuck 208 are controlled by the processor 216 of the processing unit 214 of the analyzer 202 to transport and align the integrated circuit 100 with the test probe 204. The chuck 208 provides three-dimensional control of the placement of the integrated circuit 100. While the example system 200 employs the conveyor 210 and the chuck 208 for movement of the integrated circuit 100, any type of system for moving an integrated circuit 100 may be used. For example, a human may manually place and/or align the integrated circuit 100, a robotic arm may place and/or align the integrated circuit 100, etc. Additionally or alternatively, the test probe 204 may be moved while the integrated circuit 100 is moved or remains stationary. Alternatively, the operation of the chuck 208 and the conveyor 210 may be controlled by another processor or controller that coordinates with the processor 216.

Figure 1:
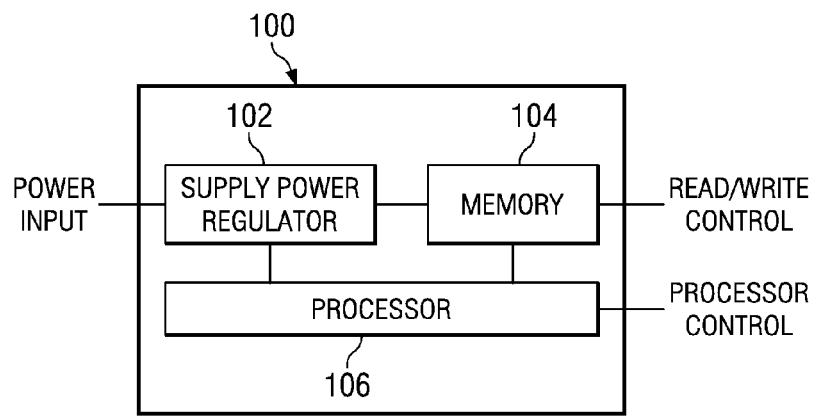
FIG. 1 is a block diagram of a known integrated circuit including a power supply.

According to the illustrated example, the UUT 206 is a wafer including a plurality of integrated circuits (including the integrated circuit 100). Alternatively, the UUT 206 may be a single integrated circuit in any medium. For example, the UUT 206 may be a single integrated circuit in package form, a single integrated circuit on a wafer, a plurality of integrated circuits in a circuit, etc. While the integrated circuit 100 in the illustrated example is implemented as illustrated in FIG. 1, any integrated circuit that includes an on-chip (i.e., on-die) supply power regulator that can be externally controlled and that allows analysis of test and/or operation results may be analyzed.

The example test probe 204 includes pins that connect to circuit connections (e.g., pads, pins, etc.) on the integrated circuit 100 so that the analyzer 202 is communicatively coupled to the integrated circuit 204. The number of pins included in the test probe 204 is based on the number of connections to be made between the analyzer 202 and the integrated circuit 100. The test probe 204 of the illustrated example includes three pins: a first pin to provide power to the integrated circuit, a second pin to control the supply power regulator 102 and read from the memory 104, and a third pin to provide a common connection. While the test probe 204 includes pins to interface with the integrated circuit, any type of communication may be used such as, for example, if the integrated circuit includes a male or female connection socket a corresponding female or male connector may be connected to the socket. Additionally or alternatively, a connection may provide control of more than one integrated circuit. For example, a circuit may include a communication interface that allows addressable communication with components of the circuit, the chuck 208 may be communicatively coupled to the integrated circuits of a wafer (the UUT 206) and include an interface allowing communication with the integrated circuits through a single connection, etc.

The analyzer 202 of the illustrated example provides power to the integrated circuit 100 via the test probe 204 using the power supply 212. The example analyzer 202 also controls and analyzes the integrated circuit 100 via the test probe 204 using the processing unit 214. While the example analyzer 202 is illustrated as an integrated unit for powering and controlling the integrated circuit, the analyzer 202 may be a system comprising multiple separate components.

The power supply 212 of the illustrated example provides power to the integrated circuit 100 via the test probe 204. According to the illustrated example, during testing of the operation of the integrated circuit 100 at different voltages, the power supply 212 provides a signal having a voltage greater than the largest voltage to be analyzed. In other words, the supply power regulator 102 of the integrated circuit 100 is programmable and, therefore, can source any of the desired voltages (i.e., the voltages to be analyzed) without requiring a change in the voltage supplied by the power supply 212. For example, the supply power regulator 102 may be a digitally controlled and/or software controlled supply power regulator that is controlled by the processor 106, directly by the processing unit 214, and/or by any other component. Thus, the analyzer 202 may output a fixed voltage to the supply power regulator 102 and may then control the supply power regulator 102 to source the proper voltages during test procedures. The power supply 212 may supply any type of signal having any desired voltage, current, and/or frequency.

The processing unit 214 of the illustrated example controls the chuck 208 and controls and analyzes the integrated circuit 100 via the processor 216 and the memory 218. While the processing unit 214 is illustrated as a simplified system including the processor 216 and the memory 218, the processing unit 214 may additionally or alternatively include any other components such as, for example, data input/output devices, user input/output devices, multiple processors, multiple memories, etc.

The processor 216 of the illustrated example executes instructions stored in the memory 218 to iteratively analyze the integrated circuit 100. In particular, the example instructions stored in the memory 218 cause the example processor 216 to control the supply power regulator 102 via the processor 106, to instruct the processor 106 to perform a memory self-test, to read the result of the memory self-test from the memory 104, and to store the result in the memory 218. Additionally or alternatively, the processor 106 may be instructed to perform any kind of self-test including a logic self-test. The example processor 216 may iteratively or in parallel analyze a plurality of integrated circuits (e.g., multiple integrated circuits on a wafer). For example, the processor 216 may analyze an integrated circuit and all integrated circuits directly surrounding the integrated circuit on a wafer and analyze the results to determine if the integrated circuit is an outlier when compared with the directly surrounding integrated circuits. Example components of the processing system 214 implemented in the example system 200 are described in conjunction with FIG. 3. An example process for analyzing the integrated circuit 100 is described in conjunction with FIG. 4.

Figure 3:
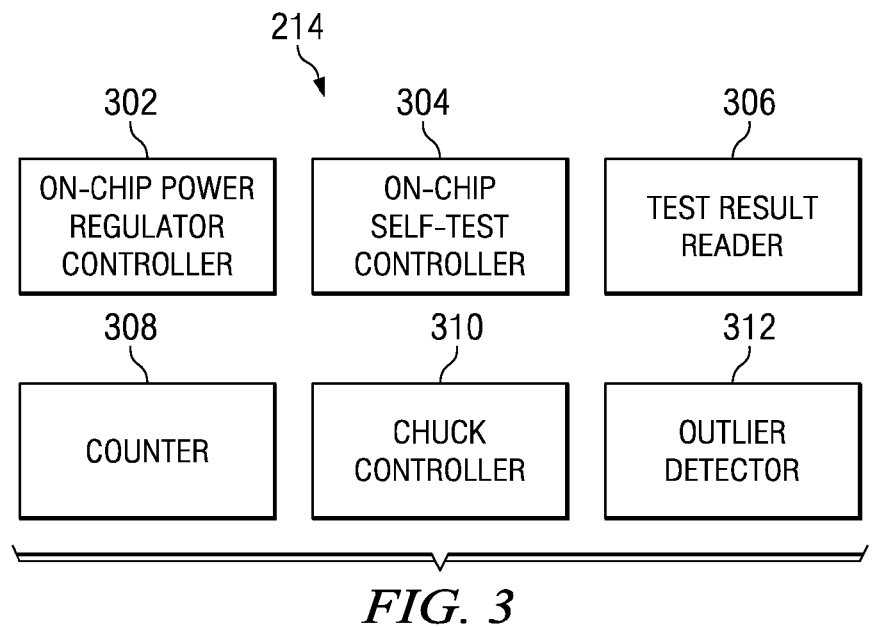
FIG. 3 is a block diagram of example components of the processing system of FIG. 2.

FIG. 3 is a block diagram of example components to implement the processing system 214 of FIG. 2. The example processing system 214 includes an on-chip power regulator controller 302, an on-chip self-test controller 304, a test result reader 306, a counter 308, a chuck controller 310, and an outlier detector 312. The example components may be implemented, for example, by instructions stored in the memory 218 and executed by the processor 216. Alternatively, as described in further detail in conjunction with FIG. 4, the components may be implemented by any combination of hardware blocks, software blocks, and/or firmware blocks.

The example on-chip power regulator controller 302 sends communications, signals, or instructions to a power supply regular on an integrated circuit (e.g., the integrated circuit 100 of FIGS. 1 and 2) to indicate how the supply power regulator should regulate supply power received by the integrated circuit. According to the illustrated example, the on-chip power regulator controller 302 instructs a supply power regulator 102 to regulate the voltage to a desired starting minimum operating voltage for an integrated circuit and indicates that such instruction has occurred to the on-chip self-test controller 304. After the on-chip self-test controller 304 causes the performance of a self-test, the on-chip power regulator controller 302 instructs the supply power regulator 102 to reduce the voltage by a desired step size. Additionally or alternatively, the on-chip power regulator controller 302 may instruct the supply power regulator 102 to iteratively increase a voltage and/or to control a current output. An integrated circuit may additionally or alternatively include a frequency control circuit (e.g., a phase lock loop circuit) to iteratively control the frequency output.

The example on-chip self-test controller 304 instructs a processor, memory, and/or other component of an integrated circuit to initiate an on-board self-test. For example, after receiving an indication that the on-chip supply power regulator controller 302 has instructed the supply power regulator of an integrated circuit to regulate a supplied power to specified conditions, the on-chip self-test controller 304 may cause a memory to perform a self-test (e.g., a built-in self test (BIST)) to determine if the memory will operate properly under the specified conditions and/or may cause a processor to perform a logic self-test to determine if the processor will operate properly under the specified conditions.

The example test result reader 306 reads a result of an on-chip self-test operation of an integrated circuit. According to the illustrated example, the test result reader 306 reads a test result stored in a memory of the integrated circuit. Additionally or alternatively, the test result reader 306 may obtain the result of a self-test in any manner such as, for example, analyzing an output of the integrated circuit, reading a register of the integrated circuit, etc.

The example counter 308 counts the number of times that the on-chip power regulator controller 302 instructs a supply power regulator of an integrated circuit to step down the voltage. The counter 308 stores the count in the memory 218. In other words, the counter 308 counts the number of times that the voltage supplied to the components of the integrated circuit is reduced. Based on the initial voltage supplied, the count, and the step size (e.g., the number of volts by which the voltage is stepped down (e.g., 0.2 volts)) the counter 308 can determine the last voltage at which a self-test was performed successfully by the integrated circuit 100. Alternatively, any other method for determining the lowest passing voltage may be used such as, for example, storing the final voltage specified to the supply power regulator, measuring the final voltage, reading a setting indicating the final voltage from the integrated circuit, etc. Additionally or alternatively, one or more counters may be included to track the frequency and/or current supplied by the supply power regulator.

The example chuck controller 310 directs the movement of the chuck 208 and the conveyor 210 to control the location of an integrated circuit disposed on the chuck 208. The chuck controller 310 of the illustrated example can control the movement of the chuck 208 in three dimensions to align the integrated circuit to be tested with the test probe 204. While the chuck controller 310 is described as a component of the processing unit 214, the chuck controller 310 (and any other component) may alternatively be separate from the processing unit. For example, one or more chuck controllers may alternatively be integrated in the chuck 208 and/or the conveyor 210.

The example outlier detector 312 analyzes the results of self-tests of multiple integrated circuits (e.g., the counts stored by the counter 308) to detect outliers in the analyzed integrated circuits. For example, the outlier detector 312 may analyze the results for the integrated circuit 100 and the eight integrated circuits surrounding the integrated circuit on the wafer 206. If the results for the integrated circuit 100 differ from the average results for the eight surrounding integrated circuits by more than a threshold amount, the integrated circuit 100 may be identified as an outlier. The outlier detector 312 may then store a reference identifying the location of the outlying integrated circuit 100 on a wafer of integrated circuits in the memory 218 so that the outlying integrated circuit 100 may later be located for correction or removal. Alternatively, the outlier detector 312 may cause the integrated circuit 100 to be marked, removed, or modified or may cause any other desired operation to be performed. While an example process for detecting outliers has been described, any desired process for detecting outliers may be used. For example, the outlier analysis technique described in U.S. Pat. No. 7,129,735 may be employed to detect outliers.

Figure 4:
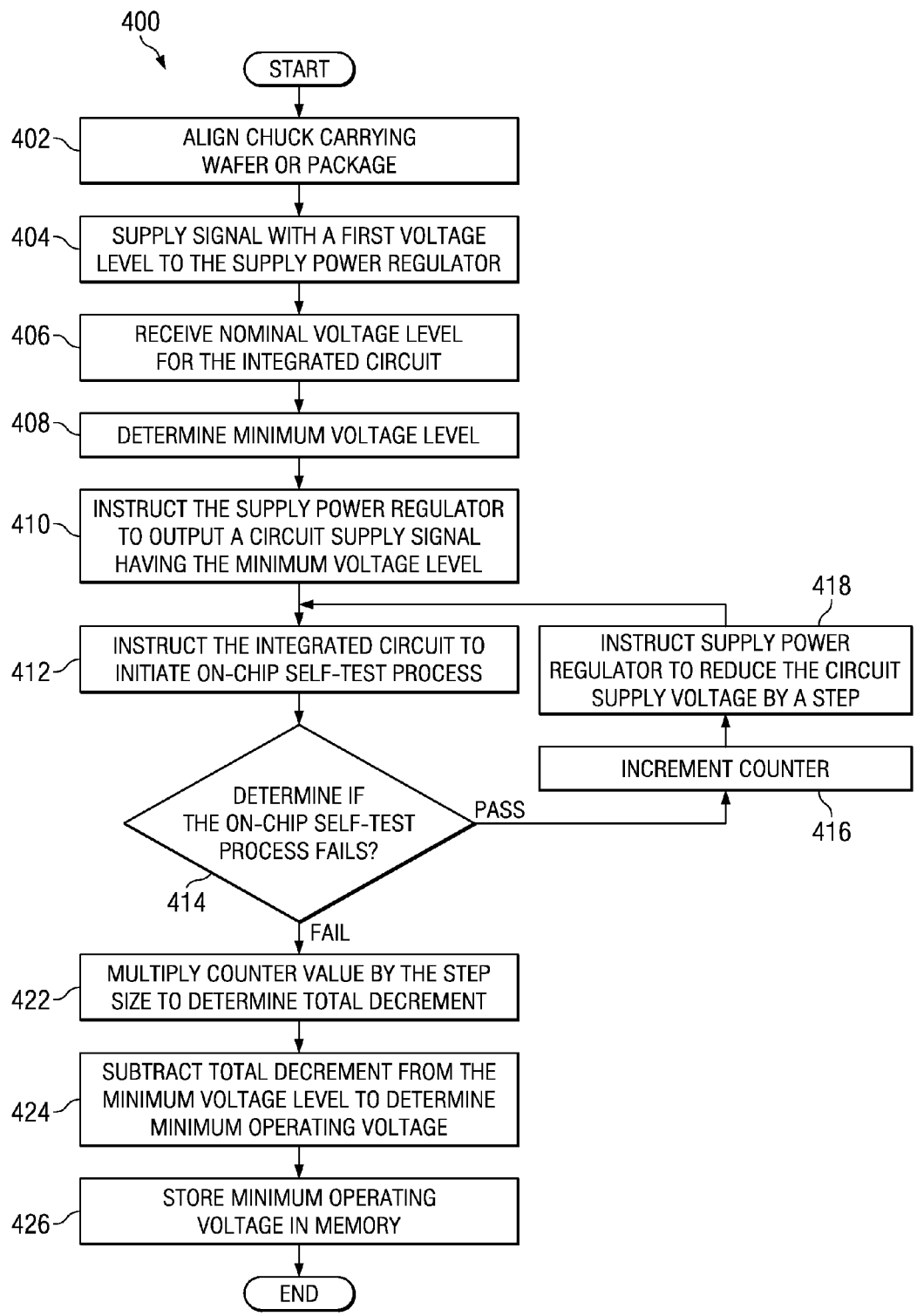
FIG. 4 is a flow diagram representative of an example process to analyze an integrated circuit.

A flow diagram of an example integrated circuit analysis process 400 is shown in FIG. 4. The process 400 may be implemented using any number of suitable techniques. The process 400 may be implemented using the blocks of FIG. 3. Alternatively, the process 400 may be implemented using any hardware blocks and/or by any software and/or any firmware executed by a processor. In one example, the process 400 may be implemented using instructions stored on computer readable media (e.g., random access memory (RAM), read only memory (ROM), flash memory, hard disk, or any other suitable media) and executed by a digital signal processor (DSP). Of course, as will be readily appreciated by those having ordinary skill in the art, other implementations of the process 400 may include combinations of hardware and/or software and/of firmware. Additionally, some portions of the process may be implemented manually.

The process 400 begins when processor 216 controls the chuck 208 and the conveyor 210 to align the integrated circuit 100 with the test probe 204 (block 402). The power supply 212 then supplies a signal with a first voltage level to the supply power regulator 102 of the integrated circuit 100 (block 404). The processor 216 then receives a nominal voltage level for the integrated circuit 100 (block 406). For example, the nominal voltage level may be the recommended operating voltage for the integrated circuit. The processor 216 then determines a minimum voltage level for the integrated circuit (block 408). For example, the minimum voltage level may be determined to be ninety percent of the nominal voltage level. In another example, the minimum voltage level may be set to an ultra low voltage as described in U.S. Pat. No. 6,184,048. Alternatively, the minimum voltage level may be specified by an input. In another alternative, any voltage level may be used. For example, a maximum voltage level, a mean or median voltage level, etc. may be used.

After determining the minimum voltage level, the processor 216 instructs the supply power regulator 102 of the integrated circuit to supply a circuit supply signal having the minimum voltage level to the memory 104 and the processor 106 (block 410). According to the example implementation, the first voltage level exceeds the minimum voltage level so that the supply power regulator can source the minimum voltage level to the memory 104 and the processor 106.

The processor 216 then instructs the memory 104 and/or the processor 106 to initiate an on-chip self-test process (block 412). For example, the processor 106 may perform a test of one or more blocks of the memory 104, the processor may execute instructions stored in the memory 104 by the processor 216, or any other system or component test may be performed. While the process of verifying operating conditions of the integrated circuit 100 is described as a self-test, any method, process, and/or procedure that can be validated by the integrated circuit 100, the processing unit 214, or any other system or component may be used.

After the on-chip self-test process is initiated (or fails to initiate) (block 412), the processor 216 determines whether the self-test process failed or passed (block 414). For example, the processor 216 may analyze an output of the integrated circuit 100, may read a value from the memory 104 of the integrated circuit 100, may read a register of the integrated circuit 100, etc. If the self-test failed (block 414), control proceeds to block 422 (described below). If the self-test succeeded (block 414), the processor 216 increments a counter (block 416). The processor 216 then instructs the supply power regulator 102 to reduce the circuit supply voltage by a desired step (e.g., 0.2 volts) (block 418). Control then returns to block 412 to initiate a self-test at the reduced circuit supply voltage.

If the self-test failed (block 414), processor 216 stops the iteration and multiplies the value of the counter by the desired step to determine the total voltage decrement before the self-test failed (block 422). The processor 216 then subtracts the total voltage decrement from the minimum voltage level to determine a minimum operating voltage (block 424). The minimum operating voltage suggests a minimum voltage at which the integrated circuit 100 can successfully operate. The processor 216 then stores the minimum operating voltage in the memory 426 (block 426). The stored minimum operating voltage may then be used to determine if the integrated circuit 100 meets desired standards, to determine if the integrated circuit 100 is an outlier when compared with other integrated circuits, to label the integrated circuit, etc. Additionally, the minimum operating voltage may be used to bin integrated circuits by operating characteristic so that the integrated circuits may be sold based on the operating characteristics. Following the storage of the minimum operating voltage, control may return to block 402 to analyze the next integrated circuit, control may proceed to an analysis process, or control may be terminated.

While the example process 400 steps a voltage down until a self-test failure is detected, the iteration process is intended as an example and other iterations may be utilized with the system 200 of FIG. 2. For example, any characteristic (e.g., frequency, current, etc.) controllable by the supply power regulator 102 may be stepped down, stepped up, or randomly/semi-randomly tested. Alternatively, the process 400 may not stop iterating after a failure is detected. For example, the process 400 may test a desired range of signal characteristics while recording the result for each signal characteristic. In another example, the process 400 may perform multiple self-tests when a self-test at a particular characteristic fails to ensure that the self-test failure is repeatable. In another example, the process 400 may use a varying step size to pin-point the minimum operating voltage. In such an example, after a failure, the process 400 may set the supply power regulator to the previous value and step the characteristic value down by an amount smaller than the previous step (e.g., 0.1 volts instead of 0.2 volts).

Figure 5:
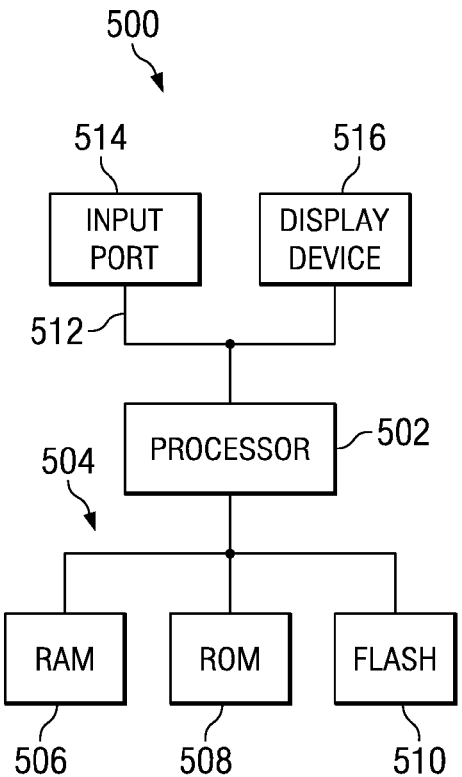
FIG. 5 is a block diagram of a processor system on which the analyzer of FIG. 2 may be implemented.

As shown in FIG. 5, an example processor system 500 that may implement the processing unit 216 or any other processing unit described herein, includes a processor 502 having associated memories 504, such as RAM 506, ROM 508, and flash memory 510. The processor 502 is coupled to an interface, such as a bus 512 to which other components may be interfaced.

The processor 502 may be any type of processing unit, such as a microprocessor and/or a DSP. The processor 502 may include on-board A/D and D/A converters.

The memories 504 that are coupled to the processor 502 may be any suitable memory devices and may be sized to fit the storage and operational demands of the system 500.

The memories 504 may also store instructions to implement the on-chip power regulator controller 302, the on-chip self-test controller 304, the test result reader 306, the counter 308, the chuck controller 310, the outlier detector 312, and/or the process 400.

An input port 514 may be coupled one or more of a user input device, a network connection, an output of a process controller (e.g., a controller of the chuck 208 and/or the conveyor 210, etc.

The display device 516 may be, for example, a liquid crystal display (LCD) display or any other suitable device that acts as an interface between the processor 502 and a user. The display device 516 includes any additional hardware required to interface a display screen to the processor 502.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A computer-implemented method for analyzing an integrated circuit including an on-chip supply power regulator and an on-chip self-test process, the method comprising:
supplying a supply signal with a first voltage level to the on-chip supply power regulator of the integrated circuit;
instructing the on-chip supply power regulator to output a circuit supply signal having a received minimum voltage level for the integrated circuit, wherein the received minimum voltage level is less than the first voltage level;
instructing the integrated circuit to initiate the on-chip self-test process;
determining if the on-chip self-test process fails;
when the on-chip self-test process does not fail:
instructing the on-chip supply power regulator to reduce the circuit supply signal to a lower voltage level that is lower than the minimum voltage level,
instructing the integrated circuit to initiate the on-chip self-test process;
when the on-chip self-test process fails:
storing an indication of the last voltage level at which the on-chip self-test process did not fail in a computer-readable memory, wherein the last voltage level indicates a minimum operating voltage of the integrated circuit.

2. The computer-implemented method as described in claim 1, further comprising determining the minimum voltage level by:
receiving a nominal voltage level for the integrated circuit;
determining the minimum voltage level as approximately ninety percent of the nominal voltage level.

3. The computer-implemented method as defined in claim 1, further comprising applying a test probe to the integrated circuit, wherein instructing the on-chip supply power regulator and instructing the integrated circuit to initiate the on-chip self-test process are performed via the test probe.

4. The computer-implemented method as defined in claim 3, wherein the test probe is two or more probes.

5. The computer-implemented method as defined in claim 3, wherein the supply signal is provided to the integrated circuit via the test probe.

6. The computer-implemented method as defined in claim 1, wherein the integrated circuit is a disposed on a wafer.

7. The computer-implemented method as defined in claim 1, wherein determining if the on-chip self-test process fails is performed by reading a register of the integrated circuit in which the self-test process stores data indicating a result of the self-test process.

8. The computer-implemented method as defined in claim 1, further comprising, when the on-chip self-test process does not fail, incrementing a counter stored in the computer-readable memory, wherein instructing the on-chip supply power regulator to reduce the circuit supply signal to a lower voltage level comprises instructing the on-chip supply power regulator reducing the circuit supply signal by a predetermined step size.

9. The computer-implemented method as defined in claim 8, further comprising:
when the on-chip self-test process fails:
multiplying the value of the counter by the predetermined step size to determine a total decrement; and
subtracting the total decrement from the minimum voltage level to determine the minimum operating voltage.

10. An apparatus for analyzing an integrated circuit including an on-chip supply power regulator and an on-chip self-test process, the apparatus comprising:
a memory;
a power supply to provide a supply signal with a first voltage level to the on-chip supply power regulator of the integrated circuit;
a processor to:
instruct the on-chip supply power regulator to output a circuit supply signal;
instruct the integrated circuit to initiate the on-chip self-test process;
determine if the on-chip self-test process fails;
when the on-chip self-test process does not fail:
instruct the on-chip supply power regulator to reduce the circuit supply signal to a lower voltage level,
instruct the integrated circuit to initiate the on-chip self-test process;
when the on-chip self-test process fails:
store an indication of the last voltage level at which the on-chip self-test process did not fail in the memory, wherein the last voltage level indicates a minimum operating voltage of the integrated circuit.

11. The apparatus as described in claim 10, wherein the processor is to determine the minimum voltage level by:
receiving a nominal voltage level for the integrated circuit;
determining the minimum voltage level as approximately ninety percent of the nominal voltage level.

12. The apparatus as defined in claim 10, further comprising a probe to communicatively couple the apparatus to the integrated circuit, wherein the processor instructs the on-chip supply power regulator and instructs the integrated circuit to initiate the on-chip self-test process via the test probe.

13. The apparatus as defined in claim 12, wherein the test probe is two or more probes.

14. The apparatus as defined in claim 12, wherein the supply signal is provided to the integrated circuit via the test probe.

15. The apparatus as defined in claim 10, wherein the integrated circuit is a disposed on a wafer.

16. The apparatus as defined in claim 10, wherein the processor is to determine if the on-chip self-test process fails by reading a register of the integrated circuit in which the self-test process stores data indicating a result of the self-test process.

17. The apparatus as defined in claim 10, wherein when the on-chip self-test process does not fail, the processor is further to increment a counter stored in the memory, wherein the processor is to instruct the on-chip supply power regulator to reduce the circuit supply signal to a lower voltage level by instructing the on-chip supply power regulator to reduce the circuit supply signal by a predetermined step size.

18. The apparatus as defined in claim 17, wherein when the on-chip self-test process fails, the processor is further to:
multiply the value of the counter by the predetermined step size to determine a total decrement; and
subtract the total decrement from the minimum voltage level to determine the minimum operating voltage.

19. A computer-implemented method for analyzing an integrated circuit including an on-chip supply power regulator and an on-chip self-test process, the method comprising:
applying a test probe to the integrated circuit;
supplying a supply signal with a first voltage level to the on-chip supply power regulator of the integrated circuit via the test probe;
determining a minimum voltage level for the integrated circuit by receiving a nominal voltage level for the integrated circuit and determining the minimum voltage level as approximately ninety percent of the nominal voltage level, wherein the received minimum voltage level is less than the first voltage level;
instructing the on-chip supply power regulator to output a circuit supply signal having the minimum voltage level via the test probe;
instructing the integrated circuit to initiate the on-chip self-test process via the test probe;
determining if the on-chip self-test process fails by reading a register of the integrated circuit in which the self-test process stores data indicating a result of the self-test process;
when the on-chip self-test process does not fail:
incrementing a counter stored in the memory,
instructing the on-chip supply power regulator to reduce the circuit supply signal by a predetermined step size,
instructing the integrated circuit to initiate the on-chip self-test process; and
when the on-chip self-test process fails:
multiplying the value of the counter by the predetermined step size to determine a total decrement,
subtracting the total decrement from the minimum voltage level to determine a minimum operating voltage, and
storing the minimum operating voltage of the integrated circuit in the memory.

* * * * *